United States Patent
Tilke et al.

(10) Patent No.: US 7,883,987 B2
(45) Date of Patent: Feb. 8, 2011

(54) SEMICONDUCTOR DEVICES AND METHODS OF MANUFACTURE THEREOF

(75) Inventors: Armin Tilke, Dresden (DE); Frank Huebinger, Poughkeepsie, NY (US); Hermann Wendt, Poughkeepsie, NY (US)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 12/762,172

(22) Filed: Apr. 16, 2010

(65) Prior Publication Data

US 2010/0197112 A1 Aug. 5, 2010

Related U.S. Application Data

(62) Division of application No. 11/805,232, filed on May 22, 2007, now Pat. No. 7,723,818.

(51) Int. Cl.
*H01L 21/76* (2006.01)
*H01L 29/00* (2006.01)

(52) U.S. Cl. ........................ 438/437; 257/520

(58) Field of Classification Search ............. 438/296, 438/422, 437; 257/513, 520, E21.628, E21.642
See application file for complete search history.

(56) References Cited

U.S. PATENT DOCUMENTS

| | | | |
|---|---|---|---|
| 6,440,792 B1 | 8/2002 | Shiao et al. | |
| 6,642,557 B2 | 11/2003 | Liang | |
| 6,864,151 B2 | 3/2005 | Yan et al. | |
| 6,936,522 B2 | 8/2005 | Steegen et al. | |
| 7,504,299 B2 * | 3/2009 | Dyer et al. | 438/244 |
| 7,723,818 B2 * | 5/2010 | Tilke et al. | 257/520 |
| 2007/0059897 A1 | 3/2007 | Tilke et al. | |

* cited by examiner

*Primary Examiner*—Calvin Lee
(74) *Attorney, Agent, or Firm*—Slater & Matsil, L.L.P.

(57) ABSTRACT

Semiconductor devices and methods of manufacture thereof are disclosed. In a preferred embodiment, a semiconductor device includes a workpiece and a trench formed within the workpiece. The trench has an upper portion and a lower portion, the upper portion having a first width and the lower portion having a second width, the second width being greater than the first width. A first material is disposed in the lower portion of the trench at least partially in regions where the second width of the lower portion is greater than the first width of the upper portion. A second material is disposed in the upper portion of the trench and at least in the lower portion of the trench beneath the upper portion.

20 Claims, 6 Drawing Sheets

SEMICONDUCTOR DEVICES AND METHODS OF MANUFACTURE THEREOF

This is a divisional application of U.S. application Ser. No. 11/805,232, entitled "Semiconductor Devices and Methods of Manufacture Thereof," which was filed on May 22, 2007 now U.S. Pat. No. 7,723,818 and is incorporated herein by reference.

TECHNICAL FIELD

The present invention relates generally to the fabrication of semiconductor devices, and more particularly to the formation of isolation structures in semiconductor devices.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers and semiconductive layers of material over a semiconductor substrate or workpiece, and patterning the various layers using lithography to form circuit components and elements thereon.

Isolation regions are used in semiconductor devices to electrically isolate active areas and electrical components from other active areas and components. Isolation regions are typically formed by forming holes or trenches in a semiconductor workpiece, and filling the holes with an insulating material.

In some semiconductor devices, trenches for isolation regions may form in a retrograde shape, being wider at lower portions than at upper portions of the trenches. When these retrograde trenches are filled with an insulating material, air gaps or voids tend to form in the larger, lower portion of the trenches, which results in a degradation of the isolation properties of the isolation regions in some semiconductor applications.

Thus, what are needed in the art are improved methods of filling retrograde isolation regions and structures thereof.

SUMMARY OF THE INVENTION

These and other problems are generally solved or circumvented, and technical advantages are generally achieved, by preferred embodiments of the present invention, which provide novel methods of forming semiconductor devices and isolation regions and structures thereof.

In accordance with a preferred embodiment of the present invention, a semiconductor device includes a workpiece and a trench formed within the workpiece. The trench has an upper portion and a lower portion, the upper portion having a first width and the lower portion having a second width, the second width being greater than the first width. A first material is disposed in the lower portion of the trench at least partially in regions where the second width of the lower portion is greater than the first width of the upper portion. A second material is disposed in the upper portion of the trench and at least in the lower portion of the trench beneath the upper portion.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely, in the formation of shallow trench isolation (STI) regions or structures for CMOS transistors. The invention may also be applied, however, to other isolation structures and methods of forming thereof for semiconductor devices, such as deep trench (DT) isolation structures used in memory products and other isolation structures, for example. Embodiments of the present invention may also be implemented in conductive retrograde structures, to be described further herein.

U.S. patent publication number 2007/0059897 A1, entitled, "Isolation for Semiconductor Devices," published on Mar. 15, 2007, which is hereby incorporated herein by reference, describes methods of forming isolation structures wherein trenches of the isolation structures are wider at the bottom than at the top. However, the methods described therein may result in the formation of voids in the bottom portion of the trenches when the trenches are filled with insulating material, which may be disadvantageous in some semiconductor device applications, for example.

Trench formation for isolation regions may be intentionally formed to be retrograde-shaped, as described in U.S. patent publication number 2007/0059897 A1 or using other methods, or the retrograde shape may inadvertently form as a result of certain etch and patterning processes, for example. Retrograde trenches may comprise inverse-T shaped trenches that are difficult to fill with insulating materials.

Attempting to use a conformal fill process, such as a high aspect ratio fill process (such as HARP™ by Applied Materials, Inc.), for example, may result in a fill void being created in the lower part of the STI trenches. One potential risk of the void formation is that the fill voids may extend to the STI surface in subsequent annealing processes, for example.

Using other types of fill processes and materials to fill retrograde shaped trenches may present other drawbacks. For example, materials such as spin-on glass (SOG) and Flow-Fill™ by Trikon tend to have high etch rates and may require a high density plasma (HDP) oxide or HARP™ capping layer. The use of these materials may also result in different etch rates for different trench sizes and may also result in the formation of buried voids during subsequent anneal processes due to material shrinkage, as examples.

Embodiments of the present invention provide novel methods of forming retrograde isolation regions that have improved fill properties. A first insulating material is first formed in wider, e.g., retrograded, areas of the lower portions of trenches. The first insulating material is removed from sidewalls of the upper portions of the trenches. A second insulating material is then used to fill the remainder of the trenches, which can advantageously be accomplished without forming voids, due to the reduction or elimination of the retrograde shape of the recess left remaining to be filled.

A method of manufacturing an isolation region of a semiconductor device will next be described with reference to FIGS. 1 through 7, which show cross-sectional views of a semiconductor device 100 at various stages of manufacturing in accordance with a preferred embodiment of the present invention.

Figure 1:
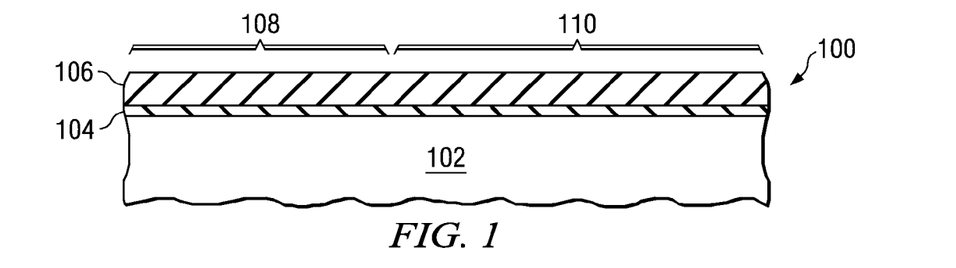
FIGS. 1 through 7 show cross-sectional views of a semiconductor device at various stages of manufacturing in accordance with a preferred embodiment of the present invention, wherein isolation regions are formed in retrograde trenches by partially filling the trenches using a conformal insulating material, etching the conformal insulating material to remove it from sidewalls of the upper portion of the trenches, and then filling the remainder of the trenches with an insulating material.

Referring to FIG. 1, first, a workpiece 102 is provided. The workpiece 102 may include a semiconductor substrate comprising silicon or other semiconductor materials covered by an insulating layer, for example. The workpiece 102 may also include other active components or circuits, not shown. The workpiece 102 may comprise silicon oxide over single-crystal silicon, for example. The workpiece 102 may include other conductive layers or other semiconductor elements, e.g., transistors, diodes, etc. Compound semiconductors, GaAs, InP, Si/Ge, or SiC, as examples, may be used in place of silicon. The workpiece 102 may comprise a silicon-on-insulator (SOI) substrate, for example.

A pad oxide 104 is formed over the workpiece 102. The pad oxide 104 may comprise about 4 nm of silicon dioxide ($SiO_2$), for example, although the pad oxide 104 may alternatively comprise other materials and dimensions. A pad nitride 106 is formed over the pad oxide 104. The pad nitride 104 may comprise about 100 nm of silicon nitride ($Si_xN_y$), for example, although the pad nitride 104 may alternatively comprise other materials and dimensions.

The semiconductor device 100 may comprise a first region 108 and a second region 110, for example, wherein the first region 108 comprises a region where narrow isolation regions such as STI regions will be formed, and wherein the second region 110 comprises a region where wider isolation regions will be formed, for example. For example, trenches in the first region 108 may comprise a width or dimension $d_{1A}$ in an upper portion of the trenches of about 80 nm or less, and an upper portion of trenches in the second region 110 may comprise a width or dimension $d_{1B}$ of about 500 nm or greater in the cross-sectional view shown. Alternatively, the trenches in the first and second regions 108 and 110 may comprise other dimensions, or the trenches across the entire surface of the semiconductor device 100 may comprise the same widths, for example, not shown.

Retrograde trenches 112A and 112B are formed in the pad nitride 106, pad oxide 104, and the workpiece 102, e.g., using a method such as one described in U.S. patent publication number 2007/0059897 A1, which is incorporated herein by reference. However, alternatively, other methods may be used to form the retrograde trenches 112A and 112B having a larger width in the lower portion than in the upper portion.

Figure 8:
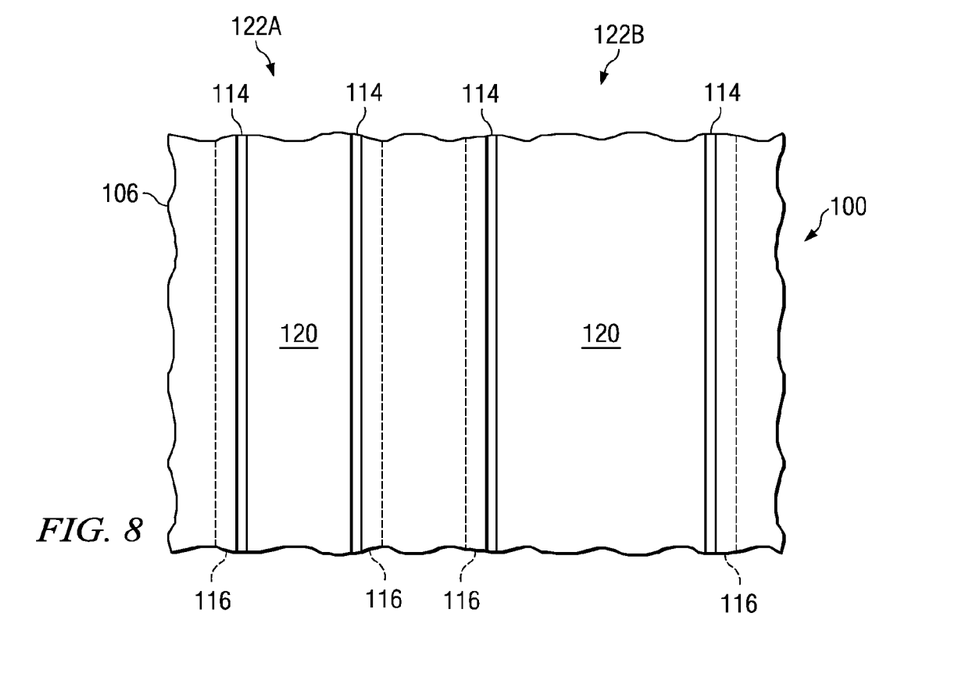
FIG. 8 shows a top view of the isolation structure shown in FIG. 7, wherein the isolation structures extend lengthwise across a workpiece in lines or trenches.

The trenches 112A and 112B may extend lengthwise, e.g., in and out of the paper as shown in FIG. 1, by several hundred nm to 1 μm or greater, for example, as shown in a top view in FIG. 8. The trenches 112A and 112B may extend lengthwise in lines as shown in FIG. 8, or they may comprise arbitrary shapes or paths, e.g., they may be cornered or meandering. The trenches 112A and 112B may comprise an L-shape, an S-shape, or other shapes across a surface of the workpiece 102. Long trenches 112A and 112B are often used in STI structures, for example. Alternatively, the trenches 112A and 112B may comprise substantially round holes, e.g., for use in deep trench (DT) isolation structures, as shown in a perspective view in FIG. 9.

Figure 2:
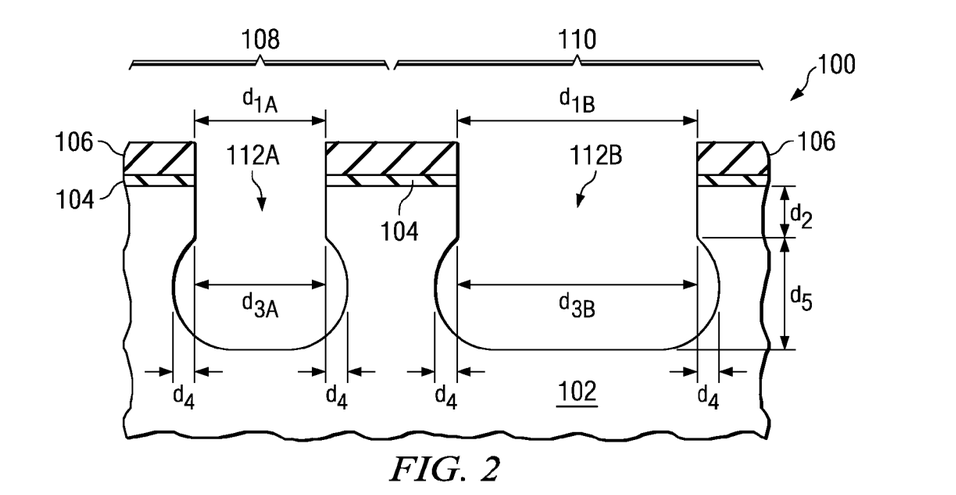

The trenches 112A and 112B are wider in lower portions than in upper portions. For example, after the formation of the retrograde trenches 112A and 112B in the first region 108 and the second region 110, respectively, the width of the upper portion of the trenches 112A and 112B comprise widths or dimensions $d_{1A}$ and $d_{1B}$, respectively. The widths $d_{1A}$ and $d_{1B}$ of the upper portion of the trenches 112A and 112B are also referred to herein as first widths, for example. The first widths $d_{1A}$ and $d_{1B}$ comprise the diameter of the trenches 112A and 112B, respectively, in the upper portion, for example. The first widths $d_{1A}$ and $d_{1B}$ preferably comprise a dimension $d_{1A}$ and/or $d_{1B}$ of about 100 nm or less in some embodiments, for example. The upper portion of the trenches 112A and 112B extends into the pad nitride 106 and the pad nitride 104. The upper portion of the trenches 112A and 112B also extends into the workpiece 102 by a depth or dimension $d_2$, which may comprise about 200 nm or less, as an example. Alternatively, the dimension $d_2$ may comprise other dimensions, for example.

The lower portions of the trenches 112A and 112B are preferably wider than the upper portions of the trenches 112A and 112B on each side by a dimension $d_4$, as shown. For example, each lower portion of the trenches 112A and 112B comprises a first region having a greater width than the first width of the upper portion of the trenches. The first region extends outwardly beneath portions of the workpiece 102 proximate the upper portion of the trenches and beneath the pad oxide 104 and the pad nitride 106 by a dimension $d_4$ on at least two sides. For example, the first region of the lower portion is shown extending outwardly away from a center of the trenches 112A and 112B, e.g., beyond the first widths $d_{1A}$ and $d_{1B}$, by a dimension $d_4$ on the left side and the right side of the trenches 112A and 112B in the cross-sectional view of FIG. 2.

The cross-section of the first region of the lower portion of the trenches 112A and 112B comprises a toroid or doughnut-like shape, wherein the inner wall comprises a substantially vertical wall, e.g., if the trenches 112A and 112B are round. If the trenches 112A and 112B comprise extended lines or arbitrary shapes across the workpiece 102, the cross-section of the first region of the lower portion of the trenches 112A and 112B comprises an extended (e.g., lengthened from side-to-side) toroid or doughnut-like shape, for example. The amount of dimension $d_4$ of the first region of the lower portion of the trenches 112A and 112B is preferably about 20 nm or greater on each side, for example, although alternatively, dimension $d_4$ may comprise other dimensions.

Note that the dimension $d_4$ of the first regions of the trenches 112A and 112B may comprise the same dimension $d_4$ for the trenches 112A and 112B regardless of the trench size. Alternatively, the dimension $d_4$ may vary with different etch chemistries and trench structures, for example, not shown.

Each of the lower portion of the trenches 112A and 112B also comprises a second region, the second region being disposed immediately beneath the upper portion, e.g., beneath the first width $d_{1A}$ and $d_{1B}$ of the upper portion of the trenches 112A and 112B. The second region of the lower portion comprises a central region of the lower portion of the trench that has a cylindrical shape, in the case of DT isolation as shown in a perspective view in FIG. 9. The second region of the lower portion may comprise a central region of the lower portion of the trench that has an extended cylindrical shape, in cases wherein the trenches extend lengthwise in lines or arbitrary shapes across a surface of the workpiece 102, as shown in FIG. 8 in a top view. The cylindrical or extended cylindrical second region is surrounded by the substantially toroid-shaped or extended toroid-shaped first region in a cross-sectional view. The second regions of the lower portion of the trenches 112A and 112B comprise widths or dimensions $d_{3A}$ and $d_{3B}$, respectively, that are defined to be substantially the same widths as the first widths $d_{1A}$ and $d_{1B}$ of the upper portion of the trenches 112A and 112B in some embodiments, as shown.

Thus, the lower portion of the trenches 112A and 112B comprises a dimension or width $(d_{3A}+2*d_4)$ and $(d_{3B}+2*d_4)$, respectively. The dimensions $(d_{3A}+2*d_4)$ and $(d_{3B}+2*d_4)$ defining the width of the lower portion of the trenches 112A and 112B are also referred to herein as second widths of the trenches 112A and 112B. The second widths $(d_{3A}+2*d_4)$ and $(d_{3B}+2*d_4)$ may comprise the diameter of the trenches 112A and 112B in the lower portion, for example, if the trenches 112A and 112B comprise round holes. The second widths $(d_{3A}+2*d_4)$ and $(d_{3B}+2*d_4)$ preferably comprise a dimension of about 150 nm or less in some embodiments, for example. The dimensions $d_{3A}$ and $d_{3B}$ of the second region of the lower portion of the trenches 112A and 112B are also referred to herein as third widths, the third widths being the same as the first widths $d_{1A}$ and $d_{1B}$, for example. The second width $(d_{3A}+2*d_4)$ of trench 112A is preferably greater than the first width $d_{1A}$ of trench 112A by about $(2*d_4)$ or greater, or about 40 nm or greater in some embodiments (i.e., in embodiments wherein dimension $d_4$ of the first region of the lower portion is preferably about 20 nm or greater), for example, although alternatively, the second widths $(d_{3A}+2*d_4)$ and $(d_{3B}+2*d_4)$ may be greater than the first widths $d_{1A}$ and $d_{1B}$ by other dimensions.

In some embodiments, the upper part of the trenches 112A and 112B may be tapered inwardly, comprising a wider opening near the top of the workpiece 102 than a lower part beneath the wider opening, before the retrograded shape of the trench begins to round out (not shown in the drawings). For example, the upper portion of the trench 112A may comprise a range of first widths $d_{1A}$, the range of first widths $d_{1A}$ of the upper portion being larger at the top and being smaller near the center of the trench 112A near the retrograded lower portion, for example. In this case, portions of the second width of the trench 112A may be greater than the range of first widths $d_{1A}$ of trenches 112A by less than $(2*d_4)$, for example. Likewise, trench 112B may also be tapered inwardly in the upper portion, also not shown in the drawings.

The lower portion of the trenches 112A and 112B preferably extends into the workpiece by a depth or dimension $d_5$ as shown, wherein dimension $d_5$ may be about the same as, or less than, dimension $d_2$ of the upper portion of the trenches 112A and 112B, for example. Alternatively, dimension $d_5$ may be greater than dimension $d_2$, as another example.

Figure 3:
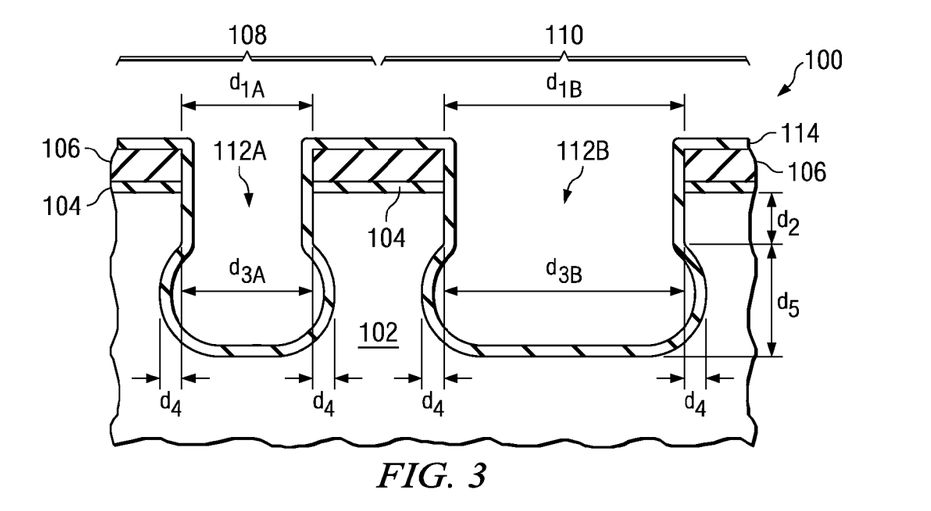

Next, after forming the retrograde trenches 112A and 112B, in accordance with a preferred embodiment of the present invention, a liner 114 is formed over the workpiece 102, e.g., over the sidewalls and bottom surface of the trenches 112A and 112B, and optionally also over exposed portions of the pad nitride and pad oxide, as shown in FIG. 3. The liner preferably comprises a first insulating material, for example. The liner 114 preferably comprises a single layer of silicon dioxide in one embodiment. In another embodiment, the liner 114 preferably comprises a first layer of silicon dioxide and a second layer of silicon nitride disposed over the first layer of silicon dioxide, to be described further herein. The liner 114 preferably comprises a thickness of about 25 nm or less, although alternatively, the liner 114 may comprise other dimensions, for example. The liner 114 is preferably substantially conformal, having the same thickness over all surfaces of the trenches 112A and 112B, as shown.

Figure 4:
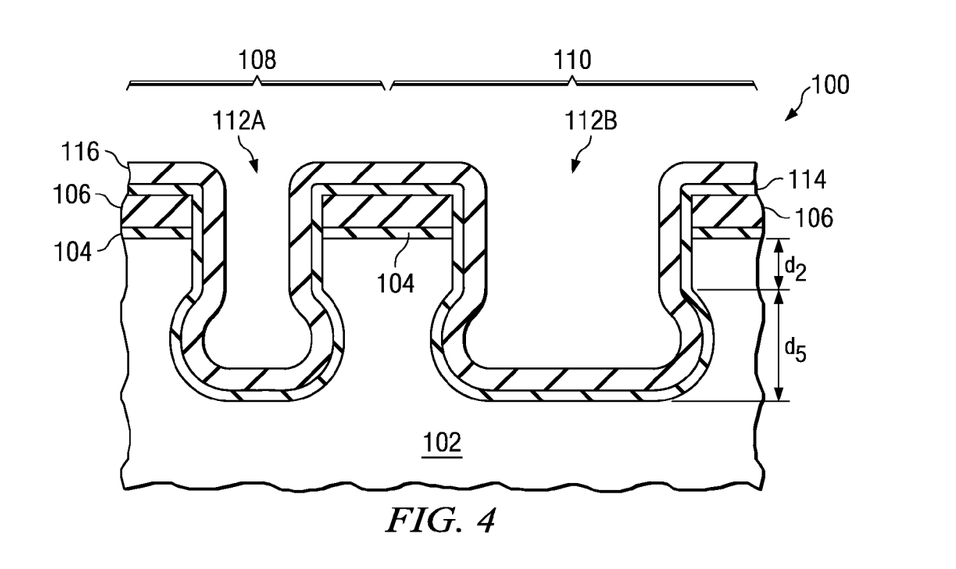

Next, a spacer material 116 is formed over the liner 114, as shown in FIG. 4. The spacer material 116 is also referred to herein as a first material or a second insulating material, for example. The spacer material 116 preferably comprises a material that is etchable selective to the first insulating material of the liner 114, for example. If the liner 114 comprises silicon dioxide, the spacer material 116 preferably comprises silicon nitride, as an example. If the liner 114 comprises a top layer of silicon nitride, the spacer material 116 preferably comprises silicon dioxide, as another example. Alternatively, the spacer material 116 and the liner 114 may comprise other etch-selective materials wherein the spacer material 116 may be etched away selective to the liner 114, while the liner 114 protects the underlying workpiece 102 from being damaged, etched away, or altered by the etch process for the spacer material 116. The spacer material 116 preferably comprises a thickness of about 50 nm or less, and more preferably comprises a thickness of about 20 to 40 nm in some embodiments, although alternatively, the spacer material 116 may comprise other dimensions.

The spacer material 116 preferably comprises a material that is conformal as deposited, having substantially the same thickness on all surfaces it is formed on, as shown in FIG. 4. The spacer material 116 is also referred to herein (e.g., in the claims) as a first material, for example. The spacer material 116 preferably comprises silicon dioxide deposited using a HARP™, chemical vapor deposition (CVD), or low-pressure CVD (LPCVD), as examples, although alternatively, other deposition methods may also be used.

Figure 5:
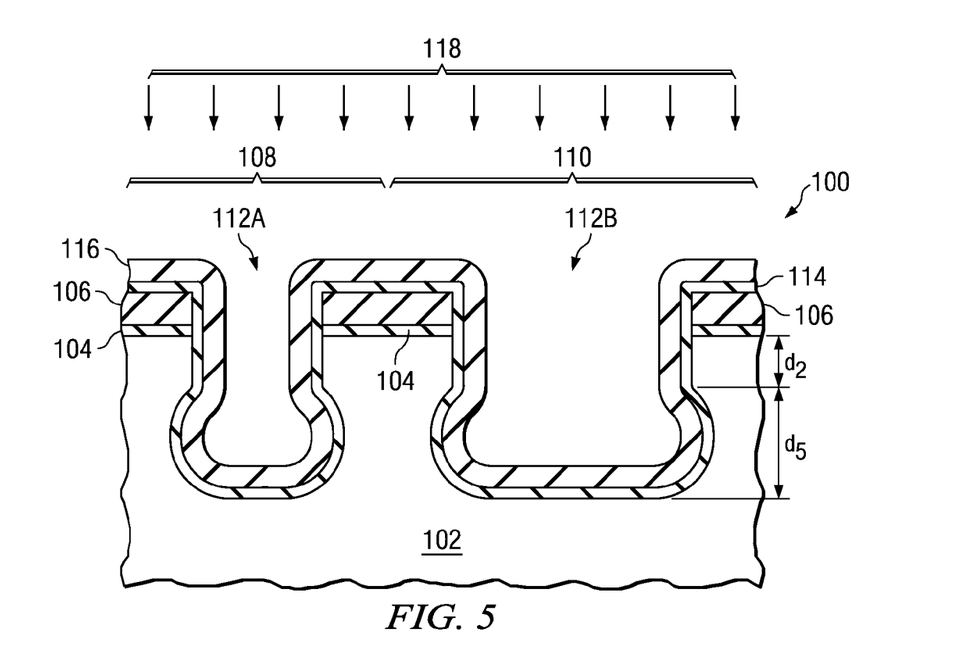

An etch process 118 is used to remove the spacer material 116 at least from the sidewalls of the trenches 112A and 112B, as shown in FIG. 5. Preferably the etch process 118 comprises an anisotropic etch process, e.g., using a dry etch process. The etch process 118 may comprise a reactive ion etch (RIE) that is adapted to etch the material of the spacer material 116, e.g., silicon nitride or silicon oxide, selective to the material of the liner 114. The etch process 118 is preferably anisotropic, e.g., it is preferably etches directionally preferentially normal to the top surface of the workpiece 102. The etch process 118 may continued for a predetermined period of time, or may be continued until a desired amount of the spacer material 116 is removed from the bottom surface of the trenches 112A and 112B, for example.

Figure 6:
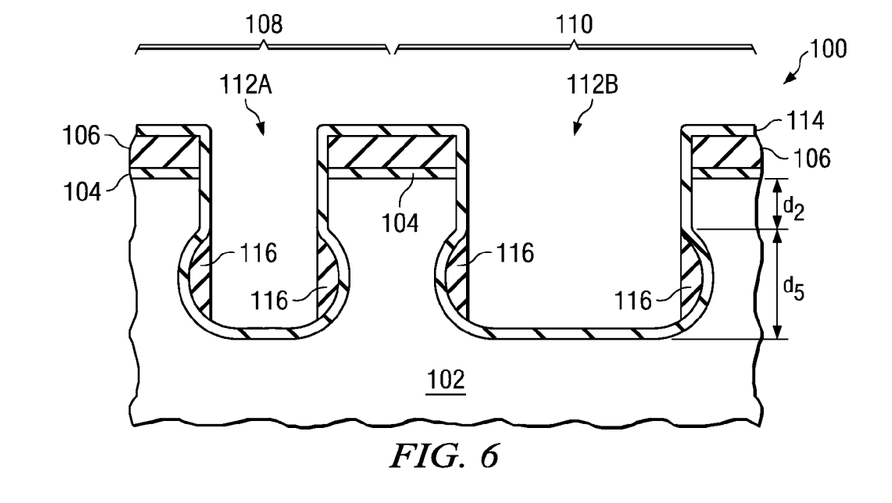

The spacer material 116 that extends beneath the workpiece 102 overhangs in the first region of the lower portion of the trenches 112A and 112B is preferably not removed during the etch process 118 for the spacer material 116, so that the spacer material 116 is left in at least a portion of the wider first region of the lower portion of the trenches 112A and 112B, as shown in FIG. 6. The spacer material 116 is preferably completely removed from the sidewalls of the trenches 112A and 112B, as shown. The spacer material 116 may also be completely removed from the top surface of the liner 114 and from the bottom surface of the trenches 112A and 112B, extending completely along the first widths $d_{1A}$ and $d_{1B}$ and the third widths $d_{3A}$ and $d_{3B}$ of the trenches 112A and 112B, respectively, for example, also shown in FIG. 6. In some embodiments, the spacer material 116 may be left partially remaining on the bottom surface of the trenches 112A and 112B, not shown.

The etch process 118 is preferably performed without the use of a lithography mask, e.g., without requiring a layer of photoresist and/or hard mask to pattern the spacer material 116, for example. Rather, the retrograde shape of the trenches 112A and 112B and the anisotropic nature of the etch process 118 result in leaving behind a portion of the spacer material 116 in the first regions of the lower portion of the trenches 112A and 112B.

The liner 114 advantageously functions as an etch stop for the partial removal of the spacer material 116 using the etch process 118, for example.

The spacer material 116 within the first region of the lower portion of the trenches 112A and 112B makes the shape of the remaining opening in the trenches 112A and 112B, which are now partially filled with the spacer material 116 in the lower portion, less retrograde, by filling at least a portion of the first regions of the lower portions of the trenches 112A and 112B. In some preferred embodiments of the present invention, for example, the first regions of the lower portions of the trenches are entirely filled with the spacer material 116, completely eliminating the retrograde shape of the trenches 112A and 112B, as shown in FIG. 6, so that the remaining trench portions that need to be filled (namely, the upper portion of the trenches and the second region of the lower portion of the trenches) have substantially vertical sidewalls along the entire lower portion of the trenches 112A and 112B.

Figure 7:
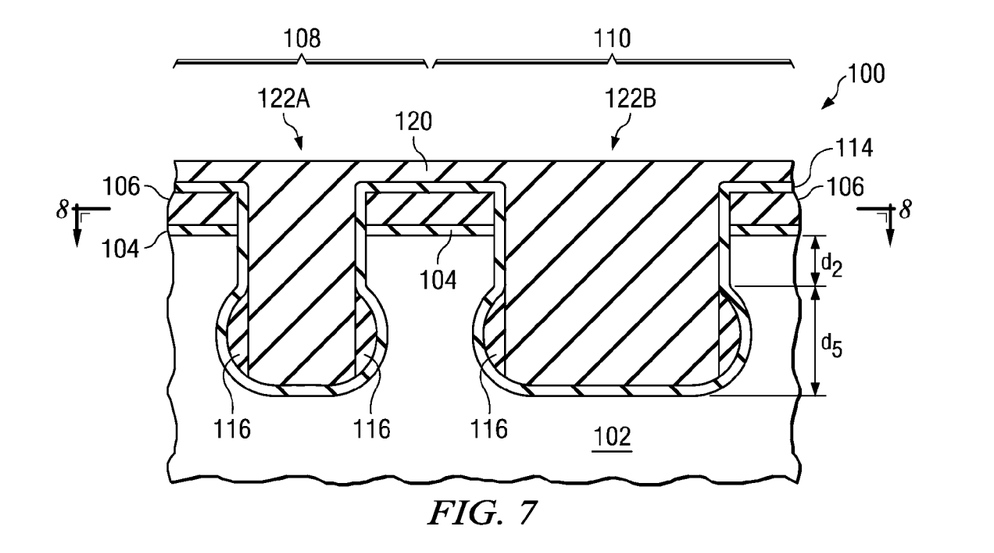

Next, a fill material 120 is deposited over the semiconductor device 100 to fill the remainder of the trenches 112A and 112B, as shown in FIG. 7. The fill material 120 is also referred to herein as a second material or a third insulating material, for example. Advantageously, the spacer material 116 residing in the first regions of the lower portion of the trenches 112A and 112B makes the filling of the remainder of the trenches 112A and 112B easier and results in a more successful fill process, resulting in a void-free fill of the trenches 112A and 112B in some preferred embodiments of the present invention, as shown in FIG. 7. The fill material 120 preferably completely fills the remainder of the trenches 112A and 112B, as shown, without the formation of voids in the lower portion of the trenches 112A and 112B, in some embodiments.

The fill material 120 preferably comprises a different material than the spacer material 116 in some embodiments, for example. In other embodiments, the fill material 120 may comprise the same material as the spacer material 116, as another example. If the fill material 120 is the same material as the spacer material 116, in some embodiments, an optional interface region may form at the junction of the spacer material 116 and the fill material 120, e.g., due to processing parameter differences between the spacer material 116 and the fill material 120 deposition processes.

The fill process may comprise depositing SOG or an insulator such as tetra ethyl oxysilane (TEOS), using a spin-on process or a HARP™, respectively, as examples. The fill material 120 preferably comprises a dielectric material typically used for STI in semiconductor devices 100, for example, such as silicon dioxide. However, alternatively, other processes and insulating materials may be used to fill the trenches 112A and 112B. The fill material 120 preferably fills the upper portion of the trenches 112A and 112B and also the second region of the lower portion of the trenches 112A and 112B, as shown.

Because the liner 114 that is formed on the sidewalls of the trenches 112A and 112B is very thin, e.g., about 25 nm or less, advantageously, the liner 114 does not impede the filling of the trenches 112A and 112B with the fill material 120, in accordance with preferred embodiments of the present invention. In some embodiments, the liner 114 may be removed prior to the trench fill process with the fill material 120, so that the liner 114 does not affect the fill process at all, for example (not shown in the drawings).

Processing of the semiconductor device 100 is then continued. For example, a chemical-mechanical polishing (CMP) process may be used to remove excess fill material 120 from over the top surface of the workpiece 102, and the liner 114, pad nitride 106, and pad oxide 104 may also be removed. Active areas may be formed in the workpiece 102, e.g., before or after the processing steps described herein.

Novel isolation regions 122A and 122B are formed by the manufacturing methods described herein, as shown in FIG. 7, wherein the isolation regions 122A and 122B comprise the trenches 112A and 112B, the liner 114, the spacer material 116, and the fill material 120. The isolation regions 122a and 122B may comprise STI regions, e.g., having a depth within the workpiece 102 of about 500 nm or less, for example. The isolation regions 112A and 112B may alternatively comprise DT isolation regions, e.g., having a depth of about 500 nm or greater, or field oxide regions, as examples.

Active areas may be disposed on either side of the trench, e.g., trench 112A or 112B. For example, a first active area may be disposed on a first side of trench 112A and a second active area may be disposed on a second side of the trench 112A opposite the first side. The isolation region 122A electrically isolates the first active area from the second active area. The first active area and the second active area may comprise transistors, diodes, capacitors, memory devices, other circuit elements, and/or combinations thereof, as examples.

Figure 9:
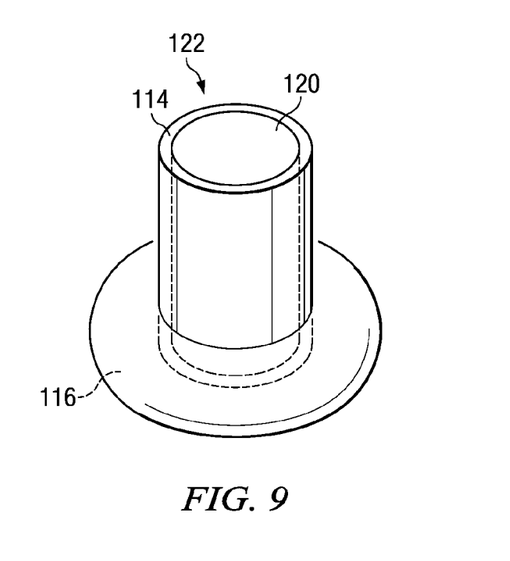
FIG. 9 shows a perspective view of an isolation structure shown in FIG. 7, wherein the isolation structure comprises a relatively round hole, such as in deep trench (DT) isolation.

FIG. 8 shows a top view of the isolation structures 122A and 122B shown in FIG. 7, where the isolation structures 112A and 112B are formed in trenches having patterns that extend lengthwise in the shape of a line across a surface of the workpiece 102, such as in STI structures. FIG. 9 shows a perspective view of an isolation structure (represented by 122) comprising a substantially round pattern, such as in DT isolation structures. The greater second width of the lower portion of the trenches of the isolation structure 122 is filled with the spacer material 116, compared to the thinner first width of the upper portion of the trenches filled with the fill material 120, which may be seen in FIG. 8 in phantom and in FIG. 9, for example.

Figure 10:
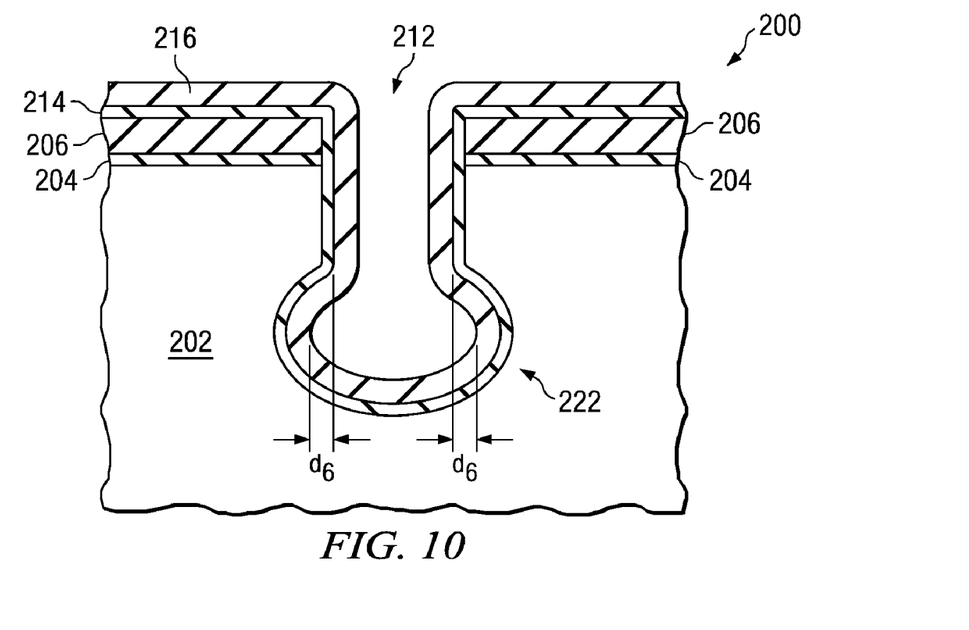
FIGS. 10 and 11 show an embodiment of the present invention wherein the conformal insulating material only partially fills a region of the lower portion of the trench having a greater width than the width of the upper portion of the trench.
Figure 11:
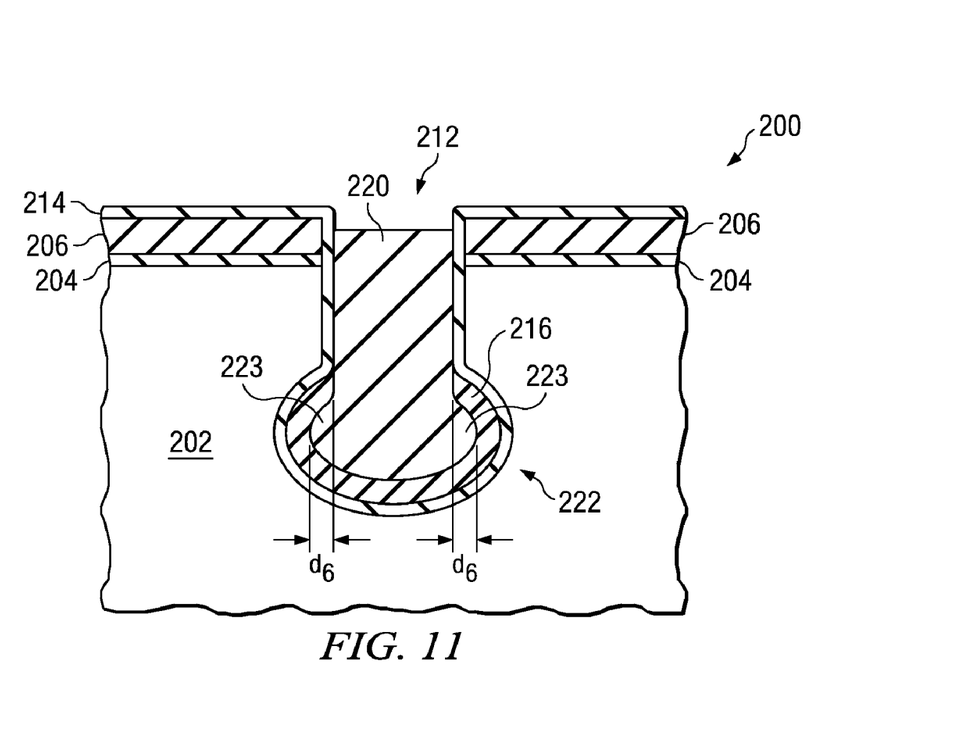

FIGS. 10 and 11 show an embodiment of the present invention in a cross-sectional view, wherein the conformal insulating material of the spacer material 216 only partially fills a region of the lower portion of a trench 212 having a greater width than the width of the upper portion of the trench 212. Like numerals are used for the various elements that were described in FIGS. 1 through 9. To avoid repetition, each reference number shown in FIGS. 10 and 11 is not described again in detail herein. Rather, similar materials x02, x04, x06, x08, etc. ... are preferably used for the various material layers shown as were described for FIGS. 1 through 9, where x=1 in FIGS. 1 through 9 and x=2 in FIGS. 10 and 11. As an example, the preferred and alternative materials and dimensions described for the liner 114 and spacer material 116 in the description for FIGS. 1 through 9 are preferably also used for the liner 214 and spacer material 216 shown in FIG. 10.

In this embodiment, the spacer material 216 is deposited in a thickness to only partially fill or line the first region (e.g., wherein the width is wider than the width of the upper portion of the trenches) of the lower portion of the trenches. For example, the spacer material 216 comprises a thickness such that a dimension $d_6$ of the first regions of the lower portion of the trench is greater than zero. Thus, the remaining trench opening within the lower portion still comprises a retrograde shape, after the anisotropic etch to remove the spacer material 216 from the sidewalls of the upper portion of the trench 212, as shown in FIG. 11. Thus, when the fill material 220 is deposited, a portion 223 of the fill material 220 may also be formed in the first regions of the lower portion of the trench 212, as shown in FIG. 11.

Although the trench 212 still has a retrograde shape after the formation of the spacer material 216 and the anisotropic etch process, the retrograde shape has been decreased, so that the overall width of the space to be filled in the lower portion has been decreased, thus making the trench 212 easier to fill and less likely to form voids. The overall width (e.g., the second width of the lower portion of the trench) is decreased by an amount equal to twice the thickness of the spacer material 216 in this embodiment, for example. Thus, in this embodiment, filling the upper portion and the second region of the lower portion of the trench 222 with the fill material or second material 220 may further comprise filling a portion of the first region of the lower portion of the trench 212 with the fill material or second material 220, as shown.

In other embodiments, a void may form in the lower part of the trench 212 between the spacer material 216 (the second insulating material) and the fill material 220 (the third insulating material), not shown in the drawings. The novel liner 214 and spacer material 216 of embodiments of the present invention disposed in the first region of the lower portion of the trench 212 decreases the size of the voids. The voids are reduced in size and are much smaller than they would be without the presence of the novel liner 214 and spacer material 216 of embodiments of the present invention in the lower portion of the trench 212, for example. The voids may form having a width of dimension $d_6$ and occupying the space where the portion 223 of the fill material 220 is shown in FIG. 11 in the first region of the lower portion of the trench 212, for example.

Figure 12:
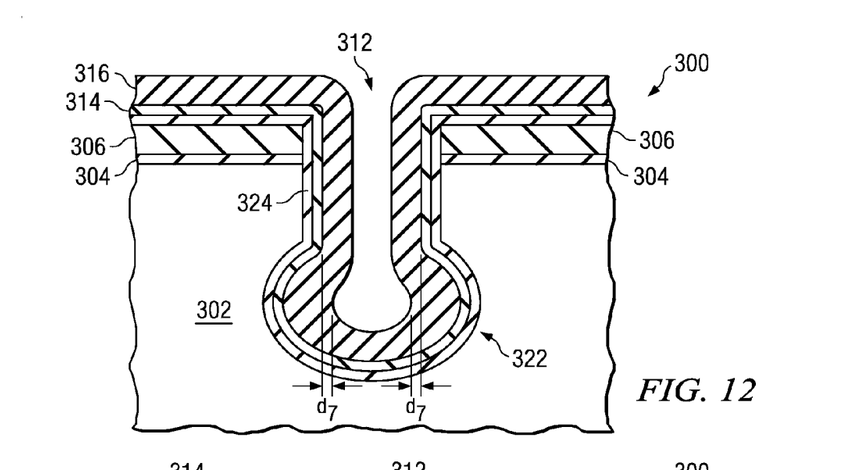
FIGS. 12 and 13 show an embodiment of the present invention wherein the conformal insulating material completely fills the region of the lower portion of the trench having a greater width than the width of the upper portion of the trench, and also wherein an optional additional liner is formed in the trench before an etch-stop liner is formed.
Figure 13:
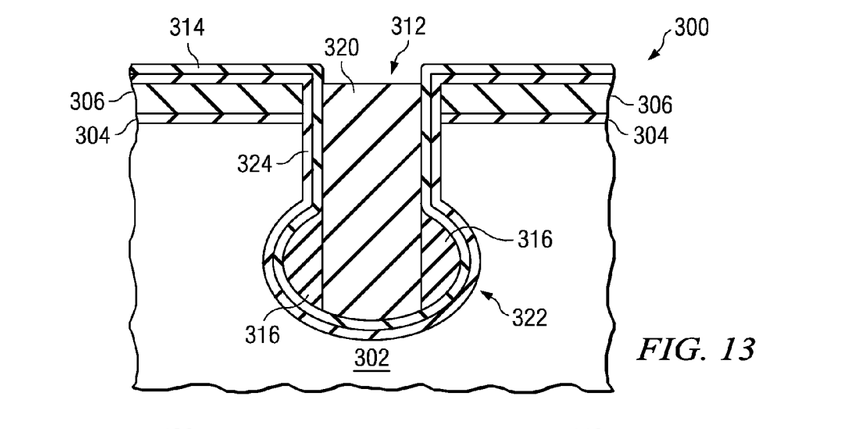

FIGS. 12 and 13 show an embodiment of the present invention in a cross-sectional view, wherein the spacer material 316 comprising a conformal insulating material completely fills the first region of the lower portion of the trench 312 having a greater width than the width of the upper portion of the trench 312. Again, like numerals are used to describe FIGS. 12 and 13 that were used to describe the previous drawings, and to avoid repetition, each element shown in FIGS. 12 and 13 is not described in detail herein again.

In this embodiment, the thickness of the spacer material 316 is preferably selected to ensure that the first regions of the lower portion of the trenches 312 (e.g., the regions that extend beneath the workpiece 302 areas proximate the upper portion of the trenches 312) are completely filled with the spacer material 316. A portion of the second region of the lower portion of the trenches 312 may be filled with the spacer material 316 in this embodiment, e.g., by a dimension $d_7$, as shown in FIG. 12. The excess spacer material 316 is then removed during the anisotropic etch process to remove the spacer material 316 from the sidewalls of the upper portion of the trench, as shown in FIG. 13.

Note that a recess is shown in the fill material 320, e.g., which may be formed during the CMP process to remove the excess fill material 320 from the top surface of the liner 314, in FIG. 13.

Also shown in FIGS. 12 and 13 is an optional liner 324 that may be formed within the trench 312 before the etch-stop liner 314 is formed. The optional liner 324 may comprise a first liner, and the liner 312 may comprise a second liner, in this embodiment. The liner 324 provides an improved interface between the STI fill material 320 and the silicon substrate 302. The liner 324 preferably extends along the entire surface of the trench 312. The liner 324 may be intentionally formed or deposited, to assist in the formation of the retrograde trenches 312, for example. Alternatively, the liner 324 may form as a part of the formation of the trenches 312 or the liner 324 may be formed using an oxidation step, by heating the workpiece 302 in the presence of an oxygen-containing gas, as another example.

The optional first liner 324 preferably comprises a thickness of about 25 nm or less, and more preferably comprises a thickness of about 5 nm or less. The first liner 324 preferably comprises silicon dioxide or silicon oxynitride, as examples, although other materials may also be used. Alternatively, the optional first liner 324 may comprise other dimensions and materials. The second liner 314 is formed over the first liner. The second liner 314 preferably comprises silicon nitride in this embodiment, for example.

Note that in some embodiments, the optional liner 324, liner 314, spacer material 316, and fill material 320 may comprise conductive materials, semiconductive materials, combinations or multiple layers thereof, or combinations and multiple layers thereof with insulating materials, as examples. The optional liner 324, liner 314, spacer material 316, and fill material 320 may be used to form conductive features such as vias, conductive plugs, or contacts, e.g., by forming the liner 324, liner 314, spacer material 316, and fill material 320 in an insulating material formed over a workpiece 302, for example, not shown.

Figure 14:
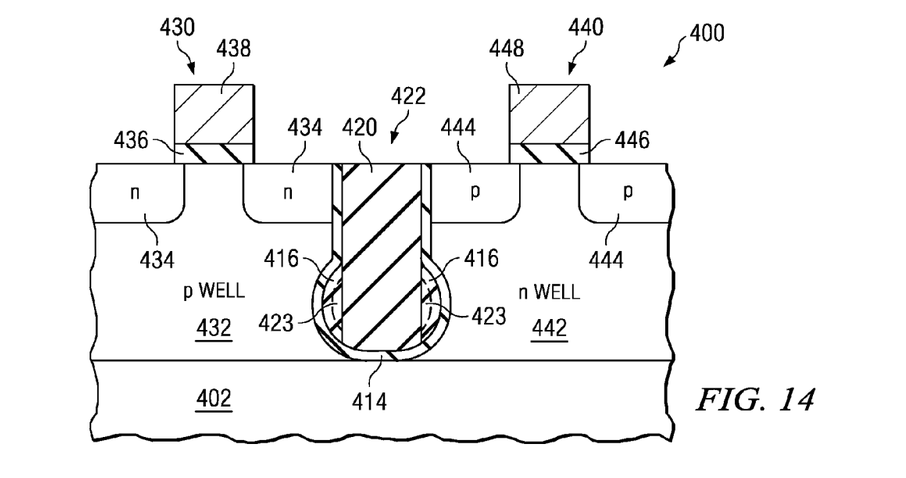
FIG. 14 shows an embodiment of the present invention wherein the novel retrograde isolation structures of embodiments of the present invention are implemented as an isolation region between two transistors of a CMOS device.

FIG. 14 shows an embodiment of the present invention, wherein a novel retrograde isolation structure of an embodiment of the present invention is implemented as an isolation region 422 between two transistors 430 and 440 of a CMOS device. One transistor 430 may comprise an n channel metal oxide semiconductor (NMOS) transistor 430, wherein source and drain regions 434 are n doped and are formed in a p well 432 formed in the workpiece 402. The NMOS transistor 430 includes a gate dielectric 436 and a gate electrode 438, as shown. Likewise, the CMOS device may include a p channel metal oxide semiconductor (PMOS) 440 transistor having source and drain regions 444 that are p doped and that are formed in an n well 442 formed in the workpiece 402. The PMOS transistor 440 includes a gate dielectric 446 and a gate electrode 448, as shown.

An isolation region 422 of embodiments of the present invention may be used for isolation between the NMOS transistor 430 and the PMOS transistor 440, as shown. The isolation region 422 includes the liner 414 and a cylindrical (or extended cylindrical, if the trenches comprise extended lines across the workpiece 402 surface) plug of the fill material 420 in the upper portion of the trench 412 and at least in a portion of the lower portion of the trench 412. The fill material 420 may optionally also fill a portion of the first region of the lower portion of the trench 412 where the lower portion is wider than the upper portion of the trench 412, as shown in phantom in FIG. 14 at 423.

Advantageously, the novel spacer material 116, 216, 316, and 416 may be used to partially or completely fill the first regions of the lower portion of the trenches 112A, 112B, 212, 312, and 412 where the lower portion is wider than the upper portion of the trenches 112A, 112B, 212, 312, and 412, making the subsequent deposition process of the fill material 120, 220, 320, and 420 easier and improving the second fill process (e.g., the deposition of the fill material 120, 220, 320, and 420, resulting in the formation of smaller voids, or resulting in no formation of voids at all, in some embodiments of the present invention, for example.

Novel methods of embodiments of the present invention involve using a two step deposition process (of the spacer material 116, 216, 316, and 416 and the fill material 120, 220, 320, and 420) with one etchback process (e.g., the anisotropic etch process 118 for the spacer material 116, 216, 316, and 416), to achieve an improved fill process for retrograde trenches 112A, 112B, 212, 312, and 412. Advantageously, the use of a subsequent HDP oxide cap is not required, because the fill material 120, 220, 320, and 420 completely fills the trenches 112A, 112B, 212, 312, and 412.

In some embodiments, both the spacer material 116, 216, 316, and 416 and the fill material may comprise a high quality oxide formed by a HARP™ or other process, avoiding moisture formation problems in the trenches 112A, 112B, 212, 312, and 412 and preventing excessive shrinkage of the fill material (e.g., of the spacer material 116, 216, 316, and 416 and the fill material 120, 220, 320, and 420), as examples.

The retrograde shape of the novel STI regions 122A, 122B, 122, 222, 322, and 422 allows a further reduction in semiconductor device 100, 200, 300, and 400 size. Active regions proximate the upper surface of the workpiece 102, 202, 302, and 402 may be placed closer together and may be separated by the upper portion of the trenches, while the wider regions of insulating material in the lower portion of the trenches 112A, 112B, 212, 312, and 412 provide improved isolation.

Advantageously, in some embodiments, the lower portion of the trenches 112A, 112B, 212, 312, and 412 have smaller voids or do not contain any voids or air gaps, further providing improved isolation properties for the isolation regions 122A, 122B, 122, 222, 322, and 422.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of filling a trench of a semiconductor device, the method comprises:
    forming a liner over a trench, the liner comprising a first insulating material, wherein the trench comprises an upper portion and a lower portion, wherein the trench comprises a retrograde shape, and wherein the upper portion comprises a first width, the lower portion comprises a second width, the second width being greater than the first width;
    forming a spacer comprising a second insulating material over the liner, wherein forming the spacer comprises removing spacer material from sidewalls of the trench in the upper portion, and leaving spacer material adjacent the sidewalls of the trench in the lower portion and at least a bottom surface of the trench in the lower portion; and
    filling the trench with a third insulating material.

2. The method according to claim 1, wherein the second insulating material of the spacer comprises a material that is etchable selective to the first insulating material of the liner.

3. The method according to claim 1, wherein forming the liner comprises forming silicon dioxide, and wherein the second insulating material comprises silicon nitride.

4. The method according to claim 1, wherein forming the liner comprises forming a first liner of silicon dioxide or silicon oxynitride and forming a second liner of silicon nitride over the first liner of silicon dioxide or silicon oxynitride, and wherein forming the spacer comprises depositing silicon dioxide.

5. The method according to claim 1, wherein forming the liner comprises forming a layer comprising a thickness of about 25 nm or less, and wherein forming the spacer comprises forming a layer comprising a thickness of about 50 nm or less.

6. The method according to claim 1, wherein forming the spacer comprises:
    forming a spacer material over the liner, the spacer material comprising the second insulating material; and
    using an anisotropic etch process, removing the spacer material from sidewalls of the trench in the upper portion and at least a bottom surface of the trench in the lower portion, and leaving the spacer material adjacent the sidewalls of the trench in the lower portion.

7. The method according to claim 6, wherein forming the spacer material comprises forming a conformal material layer.

8. The method according to claim 1, further comprising removing the liner, before filling the trench with the third insulating material.

9. A method of fabricating a semiconductor device, the method comprising:
forming a trench in a workpiece, the trench comprising an upper portion and a lower portion, the upper portion comprising a first width, the lower portion comprising a second width, the second width being greater than the first width, the lower portion comprising a first region that extends beyond the first width of the upper portion, the lower portion comprising a second region comprising a third width, the second region being disposed beneath the first width of the upper portion;
filling at least a portion of the first region of the lower portion of the trench with a first material; and
filling the upper portion and the second region of the lower portion of the trench with a second material, wherein a portion of the second material is disposed under the first material in a region of the lower portion of the trench.

10. The method according to claim 9, wherein filling at least a portion of the first region of the lower portion of the trench with the first material comprises forming the first material over sidewalls and a bottom surface of the trench, partially filling the trench, and removing the first material from at least the sidewalls of the upper portion of the trench.

11. The method according to claim 9, wherein filling the upper portion and the second region of the lower portion of the trench with the second material comprises forming a material different than the first material.

12. The method according to claim 9, wherein filling the upper portion and the second region of the lower portion of the trench with the second material comprises forming the same material as the first material.

13. The method according to claim 9, wherein filling the at least a portion of the first region of the lower portion of the trench with a first material comprises completely filling the first region of the lower portion of the trench with the first material.

14. The method according to claim 9, wherein filling the at least a portion of the first region of the lower portion of the trench further comprises filling a portion of the second region of the lower portion of the trench with the first material.

15. The method according to claim 9, wherein filling the upper portion and the second region of the lower portion of the trench with the second material further comprises filling a portion of the first region of the lower portion of the trench with the second material.

16. A method of forming an isolation structure for a semiconductor device, the method comprises
forming a trench in a workpiece, the trench comprising an upper portion, a lower portion, a bottom surface, and sidewalls, the upper portion comprising a first width, the lower portion comprising a second width, the second width being greater than the first width in a cross-section of the trench;
forming a first material over the sidewalls and the bottom surface of the trench, the first material partially filling the trench;
removing the first material from at least the sidewalls of the upper portion of the trench, wherein removing the first material comprises at least partially removing the first material from the lower portion of the trench in a region of the lower portion disposed beneath the upper portion of the trench; and
forming a second material over at least the first material and the sidewalls of the upper portion of the trench, the second material completely filling the trench.

17. The method according to claim 16, wherein removing the first material from at least the sidewalls of the upper portion of the trench comprises an anisotropic etch process.

18. The method according to claim 16, wherein removing the first material from at least the sidewalls of the upper portion of the trench comprises removing at least a portion of the first material from the lower portion of the trench.

19. The method according to claim 10, wherein removing the first material from at least the sidewalls of the upper portion of the trench comprises completely removing the first material from the lower portion of the trench in a region of the lower portion disposed beneath the upper portion of the trench.

20. The method according to claim 16, wherein forming the trench in the workpiece comprises forming at least one trench wherein the second width is greater than the first width by about 40 nm or greater.

* * * * *

UNITED STATES PATENT AND TRADEMARK OFFICE
CERTIFICATE OF CORRECTION

PATENT NO. : 7,883,987 B2
APPLICATION NO. : 12/762172
DATED : February 8, 2011
INVENTOR(S) : Tilke et al.

It is certified that error appears in the above-identified patent and that said Letters Patent is hereby corrected as shown below:

In Col. 14, line 33, claim 19, delete "claim 10" and insert --claim 18--.

Signed and Sealed this
Thirty-first Day of May, 2011

David J. Kappos
*Director of the United States Patent and Trademark Office*